United States Patent
Chan et al.

(10) Patent No.: US 9,397,214 B1
(45) Date of Patent: Jul. 19, 2016

(54) SEMICONDUCTOR DEVICE

(71) Applicant: UNITED MICROELECTRONICS CORP., Hsin-Chu (TW)

(72) Inventors: Tien-Chen Chan, Tainan (TW); Hsin-Chang Wu, Hsin-Chu (TW); Chun-Yu Chen, Taichung (TW); Ming-Hua Chang, Tainan (TW); Sheng-Hsu Liu, Changhua County (TW); Chieh-Lung Wu, Kaohsiung (TW); Chung-Min Tsai, Tainan (TW); Neng-Hui Yang, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/622,943

(22) Filed: Feb. 16, 2015

(51) Int. Cl.
*H01L 27/092* (2006.01)
*H01L 29/66* (2006.01)
*H01L 21/8238* (2006.01)
*H01L 29/78* (2006.01)
*H01L 29/36* (2006.01)
*H01L 29/161* (2006.01)

(52) U.S. Cl.
CPC .......... *H01L 29/7848* (2013.01); *H01L 29/161* (2013.01); *H01L 29/36* (2013.01); *H01L 29/785* (2013.01)

(58) Field of Classification Search
CPC ... H01L 29/7848; H01L 29/785; H01L 29/36; H01L 29/161; H01L 27/092; H01L 27/12; H01L 21/823814; H01L 21/08
USPC .................. 257/190, 335, 347, 369, E21.409, 257/E21.414, E27.111, E29.255; 438/229, 438/285, 301
See application file for complete search history.

(56) References Cited

U.S. PATENT DOCUMENTS

| | | | |
|---|---|---|---|
| 2005/0221591 A1 | 10/2005 | Bedell et al. | |
| 2012/0153387 A1* | 6/2012 | Murthy | H01L 21/28512 257/335 |
| 2013/0277752 A1* | 10/2013 | Glass | H01L 21/823821 257/369 |
| 2014/0001520 A1* | 1/2014 | Glass | H01L 29/66439 257/288 |
| 2015/0270349 A1* | 9/2015 | Cheng | H01L 29/161 257/9 |

\* cited by examiner

*Primary Examiner* — Dao H Nguyen
(74) *Attorney, Agent, or Firm* — Winston Hsu; Scott Margo

(57) ABSTRACT

A semiconductor device is provided includes a substrate, a gate structure formed on the substrate, an epitaxial source/drain structure respectively formed at two sides of the gate structure, and a boron-rich interface layer. The boron-rich interface layer includes a bottom-and-sidewall portion and a top portion, and the epitaxial source/drain structure is enclosed by the bottom-and-sidewall portion and the top portion.

10 Claims, 5 Drawing Sheets

SEMICONDUCTOR DEVICE

BACKGROUND OF THE INVENTION

1. Field of the Invention

The present invention relates to a semiconductor device, and more particularly, to a semiconductor device including an epitaxial source/drain structure.

2. Description of the Prior Art

Epitaxial structures are prevalently used in a wide variety of semiconductor applications. For example, the prior art usually forms an epitaxial layer such as a silicon germanium (hereinafter abbreviated as SiGe) layer in a single crystal substrate by performing a selective epitaxial growth (hereinafter abbreviated as SEG) method. Since the epitaxial layer has the crystalline orientation almost identical to the crystalline orientation of the substrate, the epitaxial layers serves as a raised source/drain or a recessed source/drain for the semiconductor device. The epitaxial layers are also practicable in fin field effect transistor (FinFET). Because the lattice constant of the epitaxial SiGe layer is larger than that of the silicon substrate, a strain stress is generated to the channel region of the metal-oxide semiconductor (hereinafter abbreviated as MOS) transistor device. Accordingly, carrier mobility in the channel region is improved and the speed of the MOS transistor device is increased.

Although the epitaxial structures efficiently improve device performance, it increases complexity of the semiconductor fabrication and extra concerns. For example, resistance between the epitaxial structure and the contact plugs, and resistance between the epitaxial structure and the substrate have become issue in the semiconductor device with epitaxial structures.

SUMMARY OF THE INVENTION

According to an aspect of the present invention, a semiconductor device is provided. The semiconductor device includes a substrate, a gate structure formed on the substrate, an epitaxial source/drain structure respectively formed at two sides of the gate structure, and a boron-rich interface layer. The epitaxial source/drain structure is enclosed by the boron-rich interface layer.

According to the semiconductor device provided by the present invention, the epitaxial source/drain structure is sandwiched between or enclosed by the boron-rich interface layer. Therefore, the boron-rich interface layer is always between the epitaxial source/drain structure and any other element. More important, the boron ions in the boron-rich interface layer efficaciously reduce resistance between the epitaxial source/drain structure and the element such as the contact plugs or the substrate. Consequently, resistance is reduced and electrical performance of the semiconductor device is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-3 are schematic drawings illustrating a semiconductor device provided by a first preferred embodiment of the present invention, wherein FIG. 2 is a schematic drawing in a step subsequent to FIG. 1, and FIG. 3 is a schematic drawing in a step subsequent to FIG. 2.

FIGS. 5-7 are schematic drawings illustrating a semiconductor device provided by a third preferred embodiment of the present invention, wherein FIG. 6 is a schematic drawing in a step subsequent to FIG. 5, and FIG. 7 is a schematic drawing in a step subsequent to FIG. 6.

DETAILED DESCRIPTION

Figure 1:
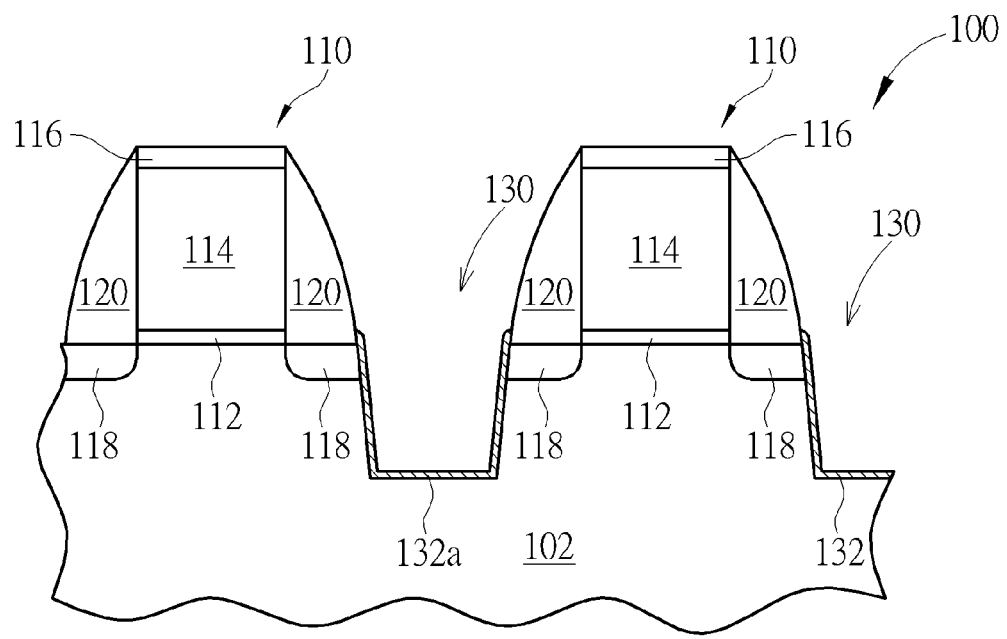
Figure 2:
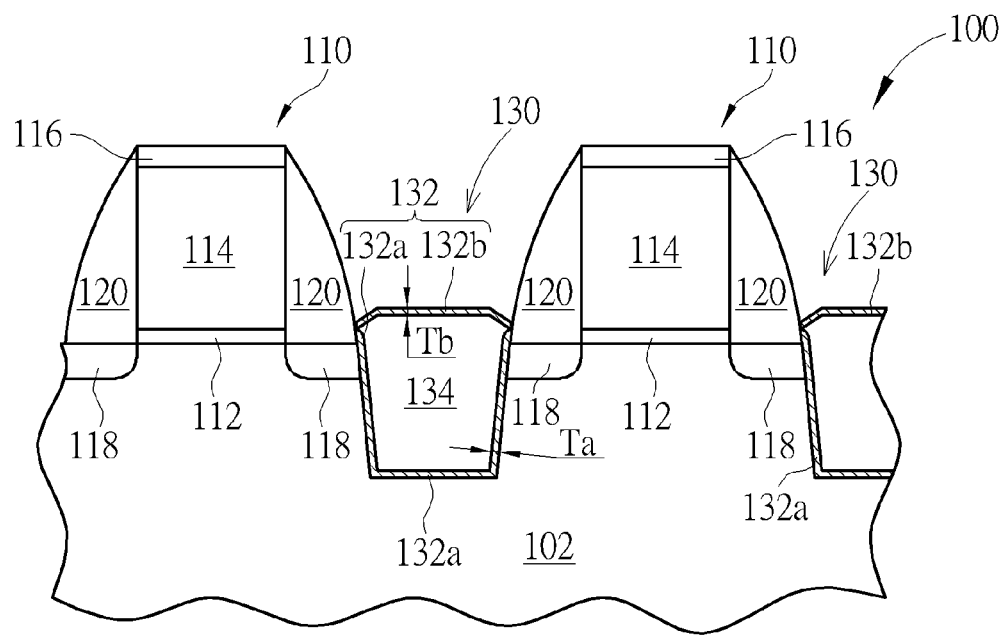
Figure 3:
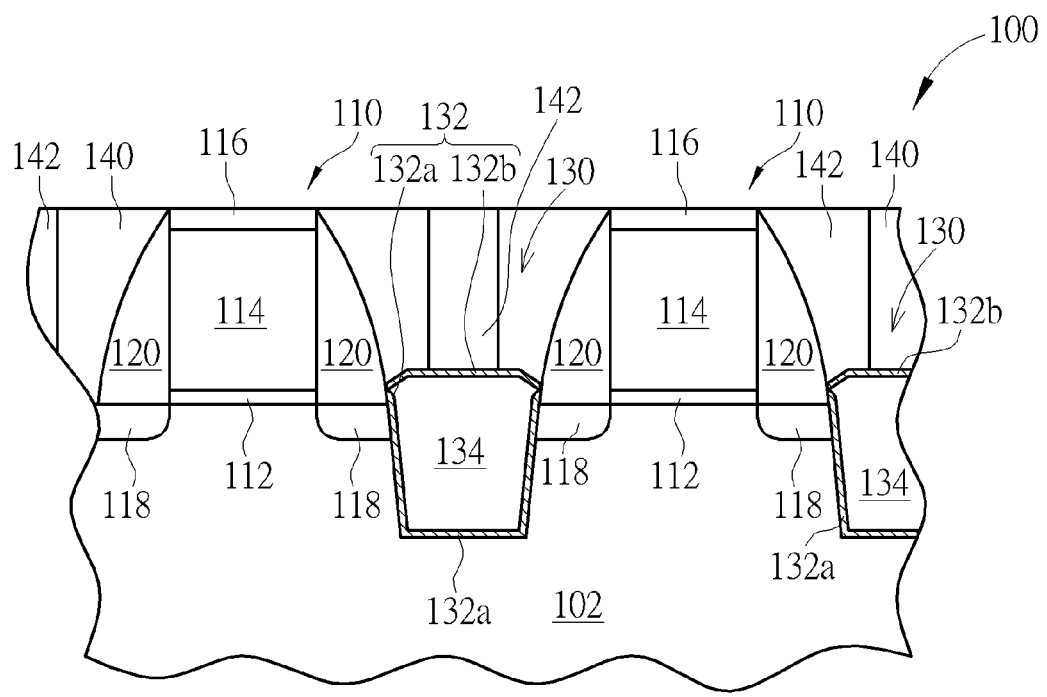

Please refer to FIGS. 1-3, which are schematic drawings illustrating a semiconductor device provided by a first preferred embodiment of the present invention. As shown in FIG. 1, a semiconductor device 100 of the preferred embodiment is provided. The semiconductor device 100 includes a substrate 102 and at least a gate structure 110 formed on the substrate 102. The gate structure 110 includes a gate dielectric layer 112 and a gate conductive layer 114 defined by a patterned hard mask 116. The gate dielectric layer 112 can include, for example but not limited to, high dielectric constant (hereinafter abbreviated as high-k) material or silicon oxide, and the gate conductive layer 114 can include metal or polysilicon. Furthermore, lightly-doped drains (hereinafter abbreviated as LDDs) 118 are formed in the substrate 102 respectively at two sides of the gate structure 110, and spacers 120 are formed on sidewalls of the gate structure 110.

Please refer to FIG. 1 again. Next, a patterned mask layer (not shown) is selectively formed. The patterned mask layer, the patterned hard mask 116 and the spacer 120 serve as an etching mask and an etching process is performed to form a recess 130 in the substrate 102 respectively at two sides of the gate structure 110. After forming the recesses 130, a cleaning step is performed to remove native oxide or other impurities from the recesses 130. Thereafter, a growth process or a deposition process such as, for example but not limited to, a chemical vapor deposition (hereinafter abbreviated as CVD) is performed. Consequently, a boron-rich layer 132a is formed in each recess 130. Furthermore, the boron-rich layer 132a can include SiGe and fluorine (F), but not limited to this. The boron-rich layer 132a includes a boron concentration, and the boron concentration is between $1.0*10^{21}$ atom/cm$^3$ and $3*10^{21}$ atom/cm$^3$, but not limited to this. The boron-rich layer 132a further includes a thickness $T_a$, and the thickness $T_a$ is between 10 angstroms (Å) and 100 Å, but not limited to this.

Please refer to FIG. 2. A SEG process is then performed to form an epitaxial structure 134 in each recess 130. The epitaxial structure 134 includes a SiGe, but not limited to this. Furthermore, the epitaxial structure 134 includes a Ge concentration gradient increasing upwardly. For example, the Ge concentration of the epitaxial structure 134 can be upwardly increased to 50%, but not limited to this. Or, the Ge concentration can include a fixed concentration. Because the lattice constant of SiGe is larger than that of the substrate 102, the epitaxial SiGe structure 134 serves as a strained-silicon structure and causes changes to band structure. Therefore the carrier mobility in the channel region is increased. Additionally, a surface of the epitaxial structure 134 and a surface of the substrate 102 can be non-coplanar as shown in FIG. 2. Furthermore, ion implantation can be performed before or after forming the epitaxial structure 134. Or, co-implant can be performed during forming the epitaxial structures 134. Thus the epitaxial structures 134 serve as an epitaxial source/drain structure 134 for the semiconductor device 100 according to the preferred embodiment. Additionally, because the ion implantation and choices of the dopant are well-known to those skilled in the art, the details are omitted herein in the interest of brevity.

Please still refer to FIG. 2. After forming the epitaxial source/drain structure 134, another growth process or deposition process such as, for example but not limited to, a CVD is performed. Consequently, a boron-rich layer 132b is formed to cover the entire epitaxial source/drain structure 134. The boron-rich layer 132b can include SiGe and F, but not limited to this. The boron-rich layer 132b includes a boron concentration, and the boron concentration is between $1.0*10^{21}$ atom/cm$^3$ and $3*10^{21}$ atom/cm$^3$, but not limited to this. The boron-rich layer 132b further includes a thickness $T_b$, and the thickness $T_b$ is between 10 Å and 100 Å, but not limited to this. It should be noted that the boron-rich layer 132a and the boron-rich layer 132b construct a boron-rich interface layer 132 as shown in FIG. 2. Particularly speaking, the boron-rich interface layer 132 is like a box enclosing the entire epitaxial source/drain structure 134.

In detail, the boron-rich interface layer 132 includes a bottom-and-sidewall portion 132a (that is the boron-rich layer 132a) and a top portion 132b (that is the boron-rich layer 132b). In the preferred embodiment, the thickness $T_a$ of the bottom-and-sidewall portion 132a is the same with the thickness $T_b$ of the top portion 132b. In the preferred embodiment, the boron concentration of the bottom-and-sidewall portion 132a is equal to the boron concentration of the top portion 132b. However, the boron concentration of the bottom-and-sidewall portion 132a can be lower than the boron concentration of the top portion 132b. For example but not limited to, the boron concentration of the bottom-and-sidewall portion 132a is $1.5*10^{21}$ atom/cm$^3$ while the boron concentration of the top portion 132b is $2.11*10^{21}$ atom/cm$^3$.

Please refer to FIG. 3. After forming the boron-rich interface layer 132, an inter-layer dielectric layer (hereinafter abbreviated as ILD) 140 is formed to embed the semiconductor device 100 and planarized. A contact plug 142 is subsequently formed in the ILD layer 140. As shown in FIG. 3, the contact plug 142 is landed on the boron-rich interface layer 132 and thus the contact plug 142 contacts the boron-rich interface layer 132. Additionally, a silicide process is selectively performed to form silicide (not shown) before forming the ILD 140 or before forming the contact plug 142.

Figure 4:
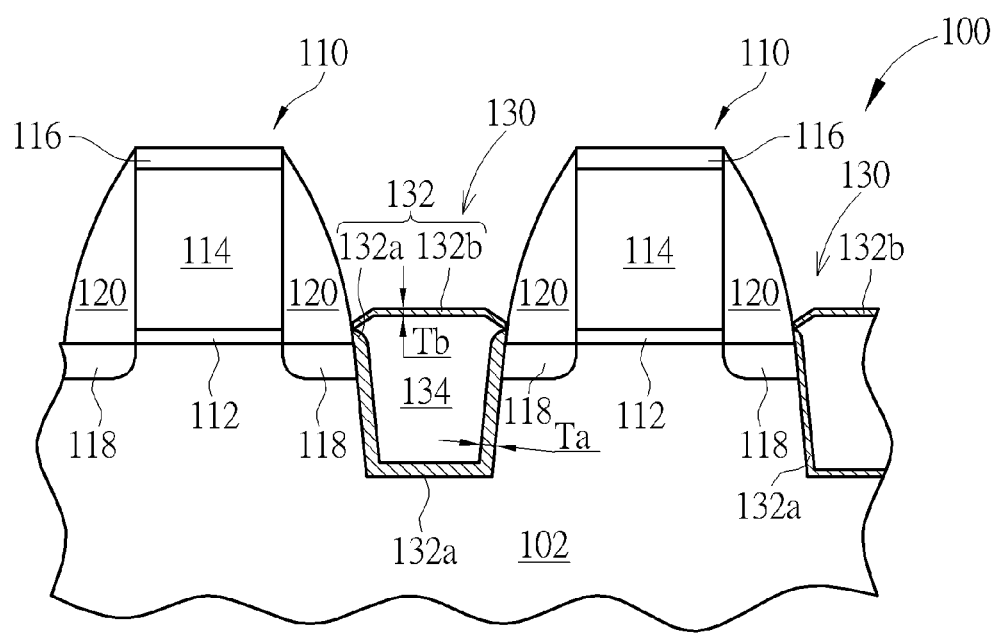
FIG. 4 is a schematic drawing illustrating a semiconductor device provided by a second preferred embodiment of the present invention.

Please refer to FIG. 4, which is a schematic drawing illustrating a semiconductor device provided by a second preferred embodiment of the present invention. It should be easily understood that elements the same in the first and second preferred embodiments are designated by the same numerals and formed by the same materials. Thus, details about those elements the same in the first and second preferred embodiments are omitted in the interest of brevity. The difference between the first and second preferred embodiments is: The thickness $T_b$ of the top portion 132b of the boron-rich interface layer 132 is smaller than the thickness $T_a$ of the bottom-and-sidewall portion 132a of the boron-rich interface layer 132. It is because the contact resistance between the contact plug and the epitaxial source/drain structure 134 is more susceptible to the thickness of the boron-rich layer 132b. Consequently, the top portion 132b including the thickness smaller than that of the bottom-and-sidewall portion 132a is sufficient to reduce the resistance. Additionally, the boron concentration of the top portion 132b can be equal to or larger than the boron concentration of the bottom-and-sidewall portion 132a in the preferred embodiment.

According to the semiconductor device 100 provided by the first and second preferred embodiments, the boron-rich interface layer 132 is formed to enclose the entire epitaxial source/drain structure 134. Therefore, the boron-rich interface layer 132 is always formed between the epitaxial source/drain structure 134 and any other element such as the substrate 102, the ILD layer 140, and the contact plug 142. The boron ions in the boron-rich interface layer 132 efficaciously reduce contact resistance between the epitaxial source/drain structure 134 and the element such as the contact plugs 142 and the substrate 102. Specifically, the resistance between the epitaxial source/drain structure 134 and the elements is reduced by 10%-18%. Consequently, electrical performance of the semiconductor device 100 is improved.

Figure 5:
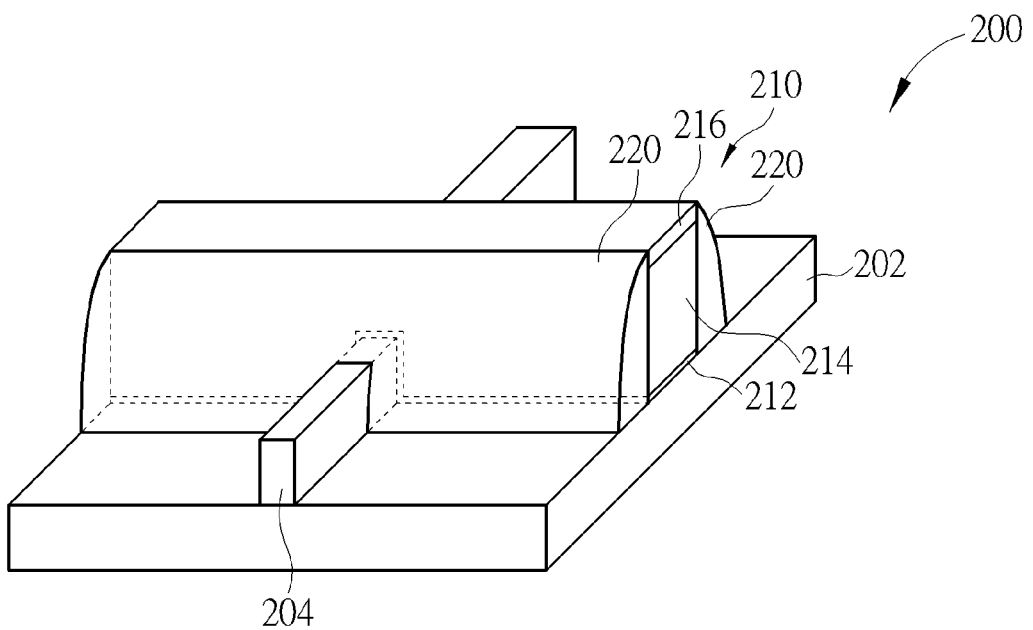
Figure 6:
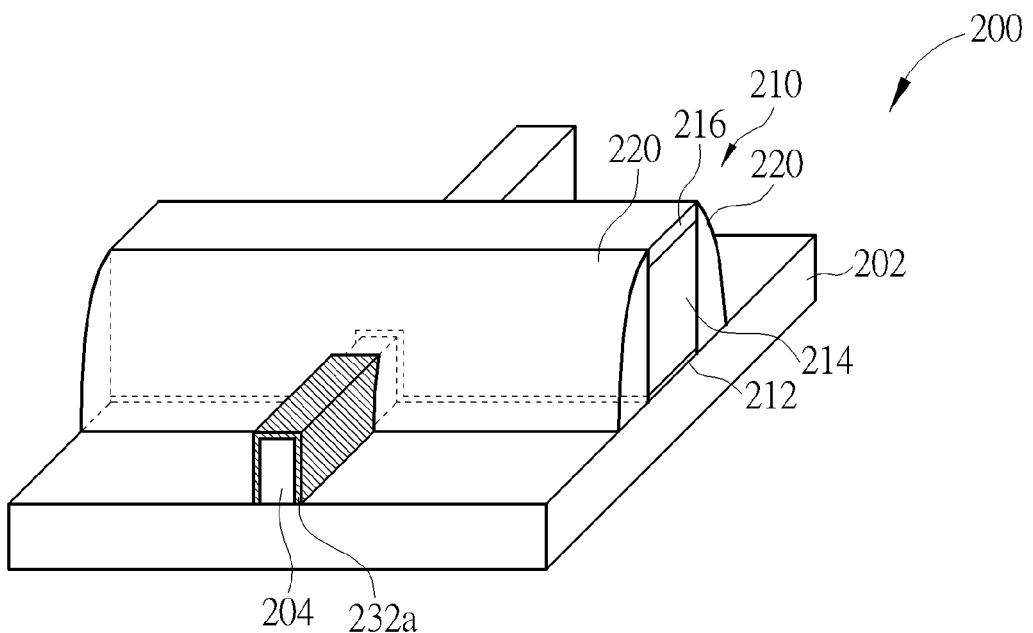
Figure 7:
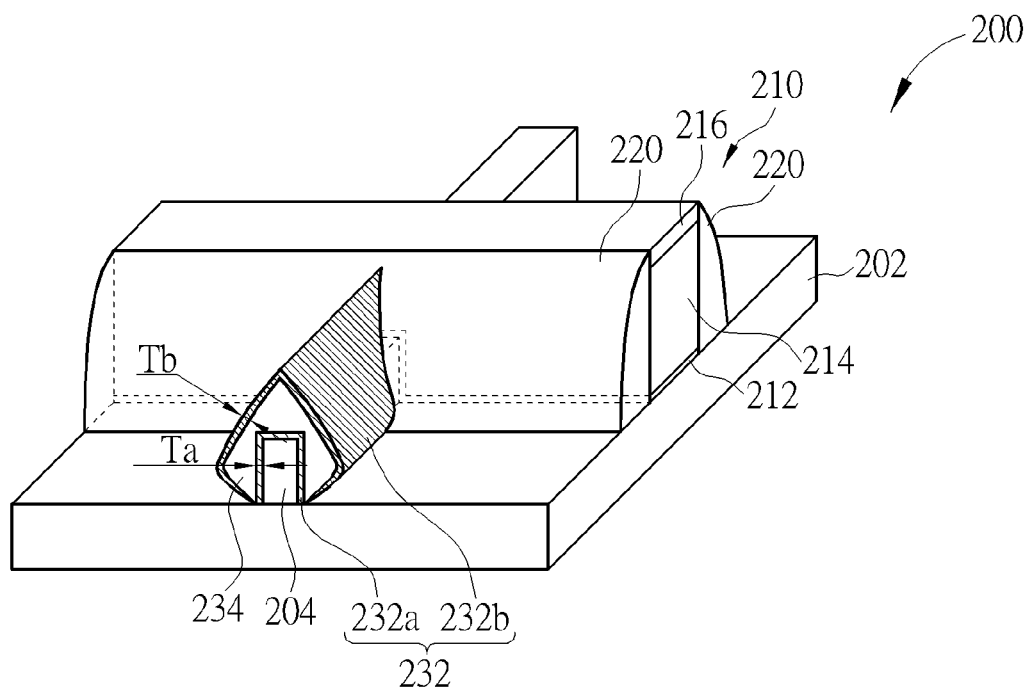

Please refer to FIGS. 5-7, which are schematic drawings illustrating a semiconductor device provided by a third preferred embodiment of the present invention. As shown in FIG. 5, a semiconductor device 200 is provided. The semiconductor device 200 includes a substrate 202, and the substrate 202 can include a silicon-on-insulator (SOI) substrate. It is well-known to those skilled in the art that the SOI substrate upwardly includes a silicon substrate, a bottom oxide (BOX) layer, and a semiconductor layer such as a single crystalline silicon layer formed on the BOX layer. However, for providing superior ground connection and thermal dissipation and for reducing interference and cost, the substrate 202 provided by the preferred embodiment also can include a bulk silicon substrate. Next, a patterned hard mask (not shown) for defining at least a fin structure for a multi-gate transistor device is formed on the substrate 202 and followed by performing an etching process. Thus a portion of the semiconductor layer of the substrate 202 is removed to form at least a fin structure 204 on the substrate 202. Next, a dielectric layer 212, a gate conductive layer 214 and a patterned hard mask 216 are sequentially formed on the substrate 202 and followed by patterning the gate dielectric layer 212 and the gate conductive layer 214 through the patterned hard mask 216. Accordingly, a gate structure 210 covering a portion of the fin structure 204 is formed on the substrate 202. As shown in FIG. 5, an extension direction of the gate structure 210 is perpendicular to an extension direction of the fin structure 204. The gate dielectric layer 212 can include, for example but not limited to, high-k material or silicon oxide, and the gate conductive layer 214 can include metal or polysilicon. After forming the gate dielectric layer 212 and the gate conductive layer 214, source/drain extension regions (not shown) are formed in the fin structure 204 and a spacer 220 are formed on sidewalls of the gate structure 210.

Please refer to FIG. 6. After forming the spacer 220, a cleaning step is performed to remove native oxide or other impurities from surface of the fin structure 204. Additionally, fin trimming can be performed if required. Thereafter, a growth process or a deposition process such as, for example but not limited to, a CVD is performed. Consequently, a boron-rich layer 232a is formed on the surface of the fin structure 204. Furthermore, the boron-rich layer 232a can include SiGe and F, but not limited to this. The boron-rich layer 232a includes a boron concentration, and the boron concentration is between $1.0*10^{21}$ atom/cm$^3$ and $3*10^{21}$ atom/cm$^3$, but not limited to this. The boron-rich layer 232a further includes a thickness $T_a$, and the thickness $T_a$ is between 10 Å and 100 Å, but not limited to this.

Please refer to FIG. 7. A SEG process is then performed to form an epitaxial structure 234 on the surface of the boron-rich layer 232a. The epitaxial structure 234 includes a SiGe, but not limited to this. Furthermore, the epitaxial structure 234 includes a Ge concentration gradient increasing upwardly. For example, the Ge concentration of the epitaxial structure 234 can be upwardly increased to 50%, but not limited to this. Or, the Ge concentration can include a fixed concentration. Because the lattice constant of SiGe is larger than that of the substrate 202, the epitaxial SiGe structure 234 serves as a strained-silicon structure and causes changes to band structure. Therefore the carrier mobility in the channel region is increased. Furthermore, ion implantation can be performed before or after forming the epitaxial structure 234, or during forming the epitaxial structures 234. Thus the epitaxial structure 234 serves as an epitaxial source/drain structure 234 for the semiconductor device 200 according to the preferred embodiment. Additionally, because the ion implantation and choices of the dopant are well-known to those skilled in the art, the details are omitted herein in the interest of brevity.

Please still refer to FIG. 7. After forming the epitaxial source/drain structure 234, another growth process or deposition process such as, for example but not limited to, a CVD is performed. Consequently, a boron-rich layer 232b is formed to cover the epitaxial source/drain structure 234. The boron-rich layer 232b can include SiGe and F, but not limited to this. The boron-rich layer 232b includes a boron concentration, and the boron concentration is between $1.0*10^{21}$ atom/cm$^3$ and $3*10^{21}$ atom/cm$^3$, but not limited to this. The boron-rich layer 232b further includes a thickness $T_b$, and the thickness $T_b$ is between 10 Å and 100 Å, but not limited to this. It should be noted that the boron-rich layer 232a and the boron-rich layer 232b construct a boron-rich interface layer 232 as shown in FIG. 7. Particularly speaking, the epitaxial source/drain structure 234 is sandwiched in between, even enclosed by the boron-rich interface layer 232.

In detail, the boron-rich interface layer 232 outwardly includes a first portion 232a (that is the boron-rich layer 232a) and a second portion 232b (that is the boron-rich layer 232b). In the preferred embodiment, the thickness $T_a$ of the first portion 232a is the same with the thickness $T_b$ of the second portion 232b. Also, in the preferred embodiment, the boron concentration of the first portion 232a is equal to the boron concentration of the second portion 232b. However, the boron concentration of the first portion 232a can be lower than the boron concentration of the second portion 232b. For example, the boron concentration of the first portion 232a is $1.5*10^{21}$ atom/cm$^3$ while the boron concentration of the second portion 232b is $2.11*10^{21}$ atom/cm$^3$, but not limited to this.

After forming the boron-rich interface layer 232, an ILD (not show) is formed to embed the semiconductor device 200 and planarized. A contact plug (not shown) is subsequently formed in the ILD layer. As mentioned above, the contact plug can be landed on the boron-rich interface layer 232 and thus the contact plug contacts the boron-rich interface layer 232. Additionally, a silicide process is selectively performed to form silicide (not shown) before forming the ILD or before forming the contact plug.

Figure 8:
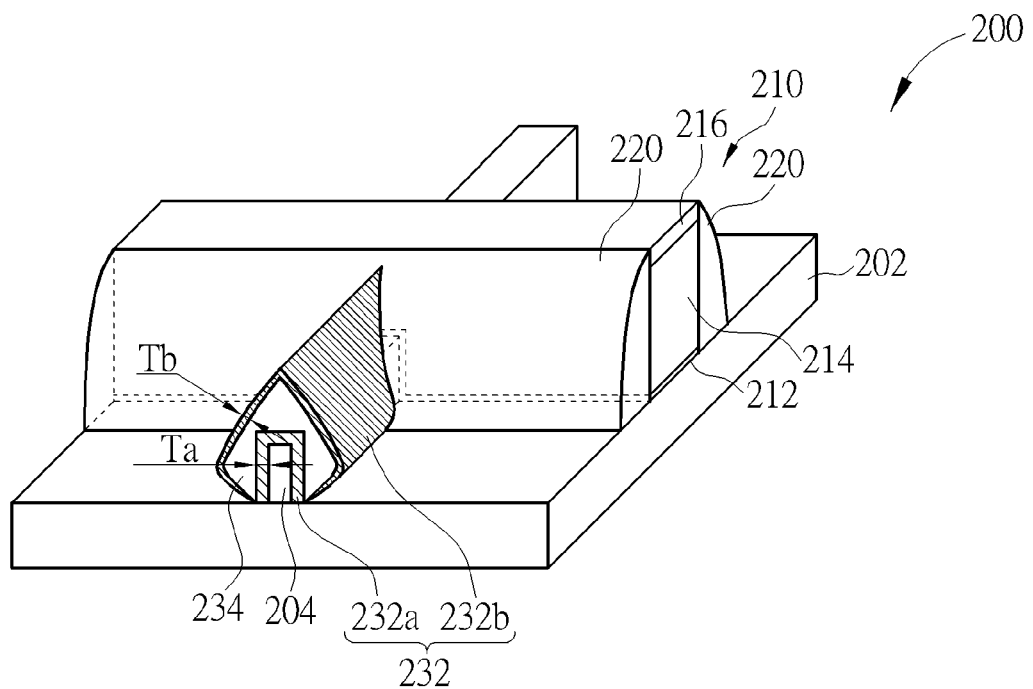
FIG. 8 is a schematic drawing illustrating a semiconductor device provided by a fourth preferred embodiment of the present invention.

Please refer to FIG. 8, which is a schematic drawing illustrating a semiconductor device provided by a fourth preferred embodiment of the present invention. It should be easily understood that elements the same in the third and fourth preferred embodiments are designated by the same numerals and formed by the same material. Thus, details about those elements the same in the third and fourth preferred embodiments are not omitted in the interest of brevity. The difference between the third and fourth preferred embodiments is: The thickness $T_b$ of the second portion 232b of the boron-rich interface layer 232 is smaller than the thickness $T_a$ of the first portion 232a of the boron-rich interface layer 232. It is because the contact resistance between the contact plug and the epitaxial source/drain structure 234 is more susceptible to the thickness of the second portion 232b. Consequently, the second portion 232b including the thickness smaller than that of the first portion 232a is sufficient to reduce the resistance. Additionally, the boron concentration of the second portion 232b can be equal to or larger than the boron concentration of the first portion 232a.

According to the semiconductor device 200 provided by the third and fourth preferred embodiments, the boron-rich interface layer 232 is formed to sandwich the epitaxial source/drain structure 234. Therefore, the boron-rich interface layer 232 is always formed between the epitaxial source/drain structure 234 and any other element such as the fin structure 204, the ILD layer, and the contact plug. The boron ions in the boron-rich interface layer 232 efficaciously reduce contact resistance between the epitaxial source/drain structure 234 and the element such as the contact plugs and the fin structure 204. Specifically, the resistance between the epitaxial source/drain structure 234 and the elements is reduced by 10%-18%. Consequently, electrical performance of the semiconductor device 200 is improved.

Figure 9:
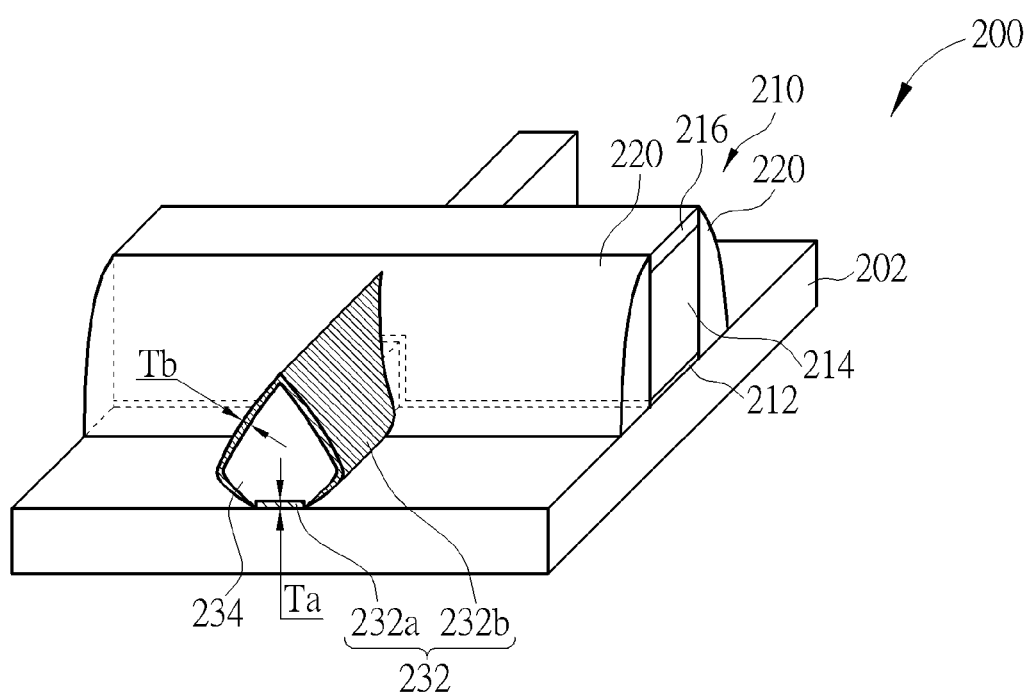
FIG. 9 is a schematic drawing illustrating a semiconductor device provided by a modification to the third and fourth preferred embodiments.

Please refer to FIG. 9, which is a schematic drawing illustrating a semiconductor device provided by a modification to the third and fourth preferred embodiments. It should be easily understood that elements the same in the modification and the third/fourth preferred embodiments are designated by the same numerals and formed by the same material. Thus, details about those elements the same in the modification and the third/fourth preferred embodiments are not omitted in the interest of brevity. The difference between the third and fourth preferred embodiments is: The fin structure 204 is etched and removed after forming the spacer 220. After removing the fin structure 204, a cleaning step is performed to remove native oxide or other impurities. Thereafter, a growth process or a deposition process such as, for example but not limited to, a CVD is performed. Consequently, a boron-rich layer 232a is formed on the surface of the fin structure 204. Materials, boron concentration and thickness of the boron-rich layer 232a can be the same with those described in the aforementioned preferred embodiments, and therefore those details are omitted for simplicity.

Please refer to FIG. 9. A SEG process is then performed to form an epitaxial structure 234 on the surface of the boron-rich layer 232a. Ion implantation can be performed before or after forming the epitaxial structure 234. Or, co-implant can be performed during forming the epitaxial structures 234. Thus the epitaxial structure 234 serves as an epitaxial source/drain structure 234 for the semiconductor device 200 according to the preferred embodiment. Additionally, because the ion implantation and choices of the dopant are well-known to those skilled in the art, the details are omitted herein in the interest of brevity. Please still refer to FIG. 9. After forming the epitaxial source/drain structure 234, another growth process or deposition process such as, for example but not limited to, a CVD is performed. Consequently, a boron-rich layer 232b is formed to cover the epitaxial source/drain structure 234. The boron-rich layer 232b can include SiGe and F, but not limited to this. As mentioned above, materials, the boron concentrations and the thickness of the boron-rich layer 232a and the boron-rich layer 232b can be the same with those described in the aforementioned preferred embodiments, and therefore those details are omitted for simplicity. It should be noteworthy that a thickness of the boron-rich layer 232a can be larger than or equal to a thickness of the boron-rich layer 232b as mentioned in the third/fourth preferred embodiments. Also, the boron concentration of the first portion 232a can be equal to or lower than the boron concentration of the second portion 232b as mentioned in the third/fourth preferred embodiments.

The boron-rich interface layer 232 outwardly includes a first portion 232a (that is the boron-rich layer 232a) and a second portion 232b (that is the boron-rich layer 232b). And the epitaxial source/drain structure 234 is enclosed by the boron-rich interface layer 232.

According to the semiconductor device provided by the present invention, the epitaxial source/drain structure is sandwiched between, even enclosed by the boron-rich interface layer. In other words, the boron-rich interface layer is always formed between the epitaxial source/drain structure and any other element. Therefore, the boron ions in the boron-rich interface layer efficaciously reduce resistance between the epitaxial source/drain structure and the element such as the contact plugs, the substrate, or the fin structure. Consequently, resistance is reduced and electrical performance of the semiconductor device is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising:
a substrate;
a gate structure formed on the substrate;
an epitaxial source/drain fin respectively formed at two sides of the gate structure; and
a boron-rich interface layer, the epitaxial source/drain structure being enclosed by the boron-rich interface layer, the boron-rich interface layer comprising a first portion and a second portion, the first portion being sandwiched in between the substrate and a bottom of the epitaxial source/drain fin, and a bottom width of the epitaxial source/drain fin being equal to or larger than a width of the boron-rich interface layer.

2. The semiconductor device according to claim 1, wherein the epitaxial source/drain fin comprises silicon germanium (SiGe).

3. The semiconductor device according to claim 2, wherein the epitaxial source/drain fin comprises a Ge concentration gradient increasing upwardly or a fixed Ge concentration.

4. The semiconductor device according to claim 1, wherein the boron-rich interface layer further comprises SiGe.

5. The semiconductor device according to claim 1, wherein the boron-rich interface layer comprises a boron concentration, and the boron concentration is between $1.0*10^{21}$ atom/$cm^3$ and $3*10^{21}$ atom/$cm^3$.

6. The semiconductor device according to claim 1, wherein the boron-rich interface layer comprises a thickness, and the thickness is between 10 angstroms (Å) and 100 Å.

7. The semiconductor device according to claim 1, wherein the epitaxial source/drain fin is enclosed in the first portion and the second portion.

8. The semiconductor device according to claim 1, wherein a boron concentration of the first portion is equal to or lower than a boron concentration of the second portion.

9. The semiconductor device according to claim 1, wherein a thickness of the second portion is smaller than a thickness of the first portion.

10. The semiconductor device according to claim 1, wherein a thickness of the second portion is the same with a thickness of the first portion.

* * * * *